United States Patent

[11] 3,615,877

[72] Inventor Kazuo Yamashita
12-3, Tachibanacho-1-Chome, Toyonaka-shi, Japan

[21] Appl. No. 889,285
[22] Filed Dec. 30, 1969
[45] Patented Oct. 26, 1971
[32] Priorities Dec. 2, 1965
[33] Japan
[31] 40/75452;
Sept. 25, 1965, Japan, No. 40/59271
June 22, 1966, 41/41147; June 29, 1965, 40/39602; July 7, 1965, 40/41866

[54] PHOTOVOLTAIC CELL AND ITS METHOD OF MANUFACTURING
4 Claims, 11 Drawing Figs.

[52] U.S. Cl. .......... 148/1.5, 136/89, 148/174, 148/186, 148/189, 317/234, 317/235, 317/237
[51] Int. Cl. .......... H01l 7/62
[50] Field of Search .......... 317/234 R, 235 R, 235 N, 237; 136/89; 148/1.5, 186, 189, 174

[56] References Cited
UNITED STATES PATENTS

| | | | |
|---|---|---|---|
| 3,443,103 | 5/1969 | Lakshmanan | 317/235 |
| 3,492,167 | 1/1970 | Nakayama et al. | 136/89 |
| 3,520,732 | 7/1970 | Nakayama et al. | 136/89 |

*Primary Examiner*—L. Dewayne Rutledge
*Assistant Examiner*—R. A. Lester
*Attorney*—Stevens, Davis, Miller & Mosher

ABSTRACT: A method of making a photovoltaic cell employing powdered polycrystalline photoelectric material, the method comprising, forming at least one electrode on a photoelectric layer and electroplating a P-type determining metal, such as copper, on said electrode at least partially through the photoelectric layer whereby the portion of said photoelectric layer subjected to said electroplating process is converted to P-type by the metal ions proceeding to the electrode, forming thereby a PN junction therearound, and a photovoltaic cell thus formed.

INVENTOR
KAZUO YAMASHITA

BY
Stevens, Davis, Miller & Mosher
ATTORNEYS

INVENTOR
KAZUO YAMASHITA

BY
Stevens, Davis, Miller & Mosher
ATTORNEYS

PHOTOVOLTAIC CELL AND ITS METHOD OF MANUFACTURING

This invention relates to methods of making photovoltaic cells employing powdered polycrystalline cadmium sulfide, cadmium selenide or their solid solution.

Photovoltaic cells having a high sensitivity to light and a spectral sensitivity lying in the range of visible rays have heretofore commonly been made by use of selenium, but a recent tendency is to use cadmium sulfide in lieu of selenium because cadmium sulfide is stable in its performance and has a long service life. In this kind of photovoltaic cells, those employing single crystalline cadmium sulfide are objectionable in that they require a lot of time for manufacture and are very expensive. On the other hand, photovoltaic cells employing an evaporated film of cadmium sulfide are also undesirable because it is difficult to obtain cells having uniform properties and a stable life.

It is therefore the primary object of the present invention to provide novel and improved methods of making photovoltaic cells by use of powdered polycrystalline cadmium sulfide, cadmium selenide or their solid solution so as to easily make, in any desired shape and at low-cost, photovoltaic cells which have a high sensitivity to visible rays, are resistive to relatively high temperatures, and have a stable service life.

The above and other objects, advantages and features of the invention will become apparent from the following description with references to the accompanying drawings, in which.

A few examples of the method according to the invention will now be described with reference to the drawings in which like reference numerals are used to denote like parts and with respect to a specific case in which polycrystalline cadmium sulfide is used in its powdered state.

EXAMPLE 1

Example 1 relates to the manufacture of a photovoltaic cell employing a sintered film of polycrystalline cadmium sulfide. In making the sintered film of cadmium sulfide, a method already priorly known in the art may be used which comprises adding copper and cadmium chloride to cadmium sulfide powder as an activator and a flux, respectively, further adding distilled water to the composition, thoroughly mixing and stirring the composition, coating the composition on a substrate of suitable material, such as glass or ceramics, allowing the composition to dry, and firing the substrate for about 5 minutes at about 600° C. in an inert atmosphere to obtain a sintered film of cadmium sulfide bonded onto the substrate. The above method may also be used to form a sintered film of cadmium selenide or of solid solution of cadmium selenide powder or a suitable powdered solid solution of cadmium sulfide and cadmium selenide may be used in lieu of the cadmium sulfide powder.

Figure 1:
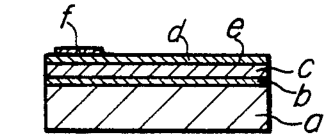
FIG. 1 PRIOR ART
FIG. 1 is a sectional view of one form of prior photovoltaic element.

According to a prior method of making a photovoltaic cell having a sintered film, an electrode *b* is deposited on a substrate *a* and a sintered film *c* of cadmium sulfide is formed on the electrode *b* as shown in FIG. 1. A metal such as copper for converting a portion of cadmium sulfide into a P-type layer *d* is then evaporated onto the sintered film *c*, and the evaporated copper deposit is heated to cause diffusion of copper for thereby forming a barrier layer *e*. An electrode *f* is then deposited on the P-type layer *d* to obtain a photovoltaic element. In making a photovoltaic cell in the above manner, copper cannot be uniformly diffused into the sintered film, and in an extreme case, the diffused portion may frequently extend to the electrode *b* since the thickness of the sintered film *c* is so thin, the thickness thereof being on the order of from 5 to 15 microns. Also a trouble frequently encountered in this photovoltaic cell is that the evaporated metal of electrode *f* reaches the electrode *b* during the evaporation step and a short circuit takes place between the electrodes *b* and *f*. It has thus been extremely difficult to make photovoltaic cells having good properties at a high rate of yield. Further, the photovoltaic cell of this structure has had the undesirable feature that its wavelength sensitivity curve lies on a considerably long wavelength side of visible light as shown by a curve A in FIG. 9 since incident light must pass through the sintered film of cadmium sulfide before reaching the barrier layer.

Figure 2:
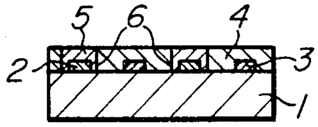
FIG. 2 is a sectional view of a photovoltaic element made by one embodiment of the method according to the present invention.
Figure 3:
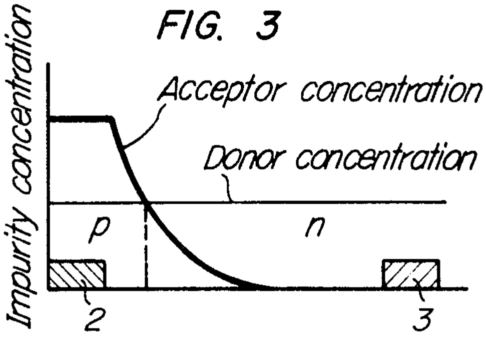
FIG. 3 is a graphic illustration of impurity concentrations relative to positions of electrodes in FIG. 2.
Figure 4:
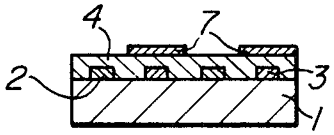
FIG. 4 is a sectional view showing an intermediate step in making the photovoltaic element according to the invention.

One embodiment of the present invention for the manufacture of a photovoltaic cell having a sintered film of cadmium sulfide will first be described. As shown in FIG. 2, two pairs a electrodes 2 and 3 of metal such as gold are provided on a substrate 1 of glass or ceramic material by means of vacuum evaporation or transfer printing. Then a sintered film 4 of cadmium sulfide is deposited by the known method described with reference to the making of the prior photovoltaic cell of FIG. 1. After this step, a metal, for example, copper, selected from the metal group consisting of copper, gold and silver, which are operative to convert cadmium sulfide into the P-type is electroplated on one of the two pairs of the electrodes 2 and 3, for example, on the pair of electrodes 2. The plating solution may have any composition provided that it does not act to dissolve cadmium sulfide. It is easily possible by this electroplating to provide a barrier layer in the cadmium sulfide deposit 4. This can be accomplished because the metal ions can diffuse through the cadmium sulfide deposit or pass through the grain boundaries of cadmium sulfide to reach the electrodes 2 by the presence of a strong electric field established in the vicinity of the electrodes 2. It is considered that a portion of cadmium sulfide is converted into a P-type region 5 and a barrier layer 6 is thereby formed during the above step. Therefore, the P-type and N-type regions between the electrodes 2 and 3 have impurity concentrations as shown in FIG. 3. A photovoltaic cell may then be obtained by connecting external terminals with the two pairs of electrodes 2 and 3 and by providing external fittings thereon. In lieu of the above-described manner of manufacture, a mask 7 may be placed on each of the electrodes 3 on the sintered film 4 of cadmium sulfide, as shown in FIG 4, and electroplating may then be effected. Alternatively, a metal which will provide a barrier layer in the cadmium sulfide film 4 may be electroplated on the electrodes 2, and a metal such as aluminum or indium which will convert cadmium sulfide into an N-type region may then be electroplated on the other electrodes 3.

Figure 5:
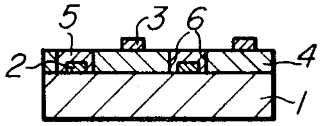
FIGS. 5 and 6 are sectional views of photovoltaic elements made by modifications of the method according to the invention.
Figure 6:
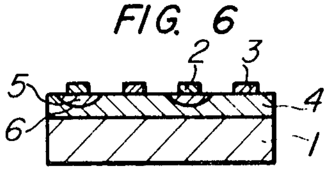

In the above embodiment of the present invention, the electrode pairs are provided on the glass substrate for the purpose of applying electroplating to the electrodes 2. Therefore, the other electrodes 3 may be provided in a later step as shown in FIG. 5, or the electrodes may be provided by vacuum evaporation after having made the sintered film of cadmium sulfide and one of the pair of electrodes may be subjected to electroplating as shown in FIG. 6.

Figure 9:
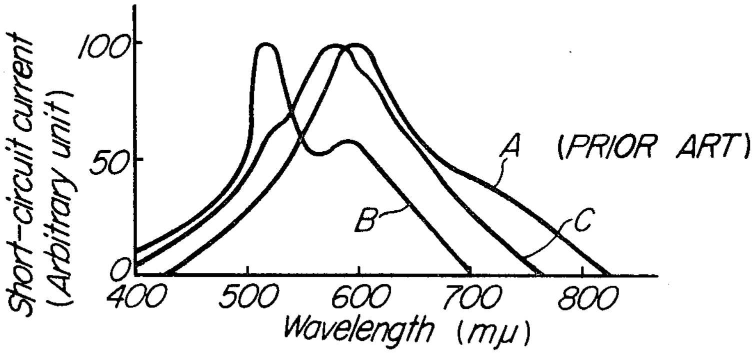
FIG. 9 is a graphic illustration of spectral sensitivity characteristics of the photovoltaic cells made according to the invention compared with a prior photovoltaic cell.

The photovoltaic element obtained by the above process has a solar conversion efficiency of about 2 percent and shows a characteristic as represented by a curve B in FIG. 9. The photovoltaic cell obtained by the above method shows a maximum sensitivity in the neighborhood of the fundamental absorption edge of cadmium sulfide since the incident light can directly reach the barrier layer. The above-described method of the present invention can be therefore very advantageously used for the manufacture of photovoltaic cells intended for use with visible rays.

EXAMPLE 2

Figure 7:
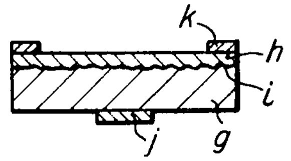
FIG. 7 PRIOR ART
FIG. 7 is a sectional view of another form of prior photovoltaic cell.

Example 2 relates to the manufacture of a photovoltaic cell employing powdered cadmium sulfide. In a prior method of making photovoltaic cells employing powdered cadmium sulfide, cadmium sulfide powder is molded by compression to form a platelike molded block *g* as shown in FIG. 7. A metal such as copper which is operative to convert cadmium sulfide into a P-type region is then evaporated onto one surface of the block *g* and the block *g* is then heated in an inert atmosphere to cause diffusion of copper so as to obtain a P-type region *h* and a barrier layer *i* in the cadmium sulfide block *g*. Thereafter, an electrode *j* of indium, making ohmic contact with the N-type region of cadmium sulfide, and an electrode *k* of gold, making ohmic contact with the P-type region of cadmium sulfide, are deposited by vacuum evaporation. According to this prior method, however, copper diffusion takes place mainly along the grain boundaries and cannot advance in uniform block owing to the fact that the compression molded block consists of powdered cadmium sulfide. As a result, the P-type region has different thicknesses at various parts of the block, as shown in FIG. 7. The photovoltaic cells made by the prior method, thus have greatly fluctuating characteristics and it has been difficult to obtain a satisfactory PN junction.

Figure 8:
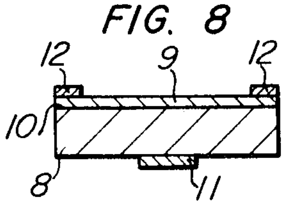
FIG. 8 is a sectional view of a photovoltaic cell made by another embodiment according to the invention.

Another embodiment of the present invention eliminating the defect as pointed out in the above will be described in detail hereunder. According to the method of the invention, powdered cadmium sulfide is molded under pressure and heat to provide a compression molded block 8 as shown in FIG. 8. A coating solution containing copper and cadmium chloride, as an activator and a flux, respectively, is mixed with cadmium sulfide, is coated on the block 8, and is allowed to dry. Then the block 8 is fired for 5 minutes at 600° C. in an inert atmosphere to obtain a sintered film 9 of cadmium sulfide having a film thickness of less than about 5 microns. Copper is then evaporated onto the sintered film 9 and is heated in a gas stream containing 1.5 to 20 percent oxygen or sulfur to diffuse therein for thereby converting the sintered film 9 into a P-type region and obtaining a barrier layer 10. Thereafter, an electrode 11 of indium, making ohmic contact with the N-type cadmium sulfide layer, and an electrode 12 of gold, making ohmic contact with the P-type cadmium sulfide layer, are deposited by vacuum evaporation.

In the step of forming the P-type cadmium sulfide layer in the method of making a photovoltaic element according to the invention, copper can be diffused solely into the sintered film because copper diffuses faster in the sintered film than in the compression molded block. Therefore, the sintered film can be solely converted into a P-type region and a satisfactory PN junction can be obtained between the sintered film and the compression molded block. Since the P-type region in this case takes the form of a sintered film, the thickness of the P-type region can be set at any desired value of uniform thickness by controlling the thickness of the sintered film.

The content of oxygen or sulfur in the gas stream used in diffusing copper into the sintered film is limited to 1.5 to 20 percent because their effect is not evident with the oxygen or sulfur content of less than 1.5 percent, while with the content of more than 20 percent, copper would be oxidized or sulfurized. The photovoltaic cell made by the above process shows a spectral response characteristic as represented by a curve C in FIG. 9. The spectral response of the photovoltaic cell made by this method lies as a whole on the long wavelength side of visible rays since the incident light reaches the PN junction after passing through the P-type layer. However, due to a greater area of PN junction than in the photovoltaic cell of example 1, the photovoltaic cell of example 2 develops a higher light output and has a solar conversion efficiency as high as about 4 percent.

Figure 10:
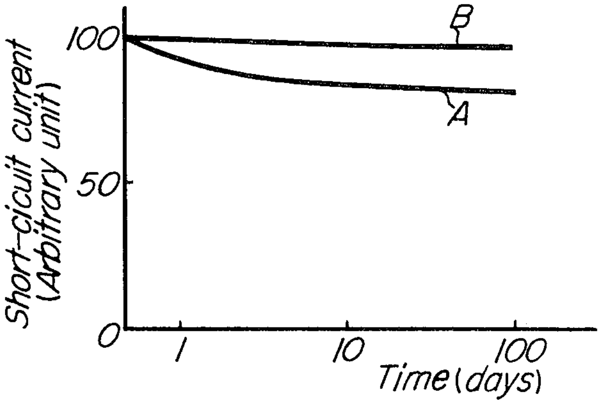
FIG. 10 is a graphic illustration of aging characteristics of the photovoltaic cell.
Figure 11:
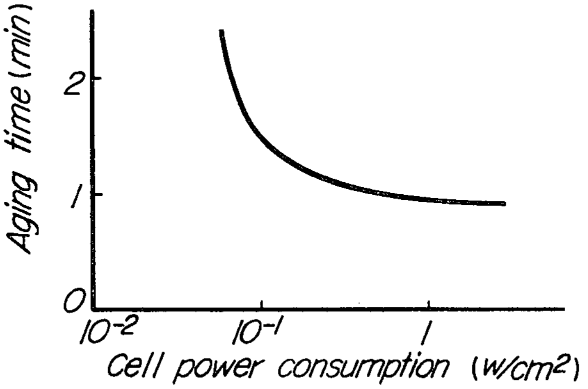
FIG. 11 is a graphic illustration of preferred conditions for aging.

Short circuit current of the photovoltaic cells made according to the invention, somewhat varies in accordance with the lapse of time as shown by a curve A in FIG. 10 and the cells need to be subjected to aging treatment. As one example of such aging treatment, the photovoltaic cell may be operated for a short period of time under a certain fixed illumination so that the particular cell consumes its maximum power. Such treatment is considered effective since the metal accumulated at the grain boundaries of cadmium sulfide during the electroplating or diffusing step is caused to diffuse into cadmium sulfide due to the effect of electric field and heat, and the cell performance is thereby stabilized. It is therefore necessary to apply electric power for a time of more than a certain fixed value in order that the aging treatment can be satisfactorily effected. FIG. 11 shows the relation between power consumption of the photovoltaic cell and the minimum time of aging at particular power consumption when the aging is carried out at room temperature. For example, it will be known that an aging time of more than at least 1.5 minutes is required at a cell power consumption of 0.1 watt per square centimeter. The effect of aging will be small in case of a treatment at shorter times because heat cannot be sufficiently developed in such a case. A curve B in FIG. 10 shows variation with respect to lapse of time of short circuit current of a photovoltaic cell having been subjected to aging treatment for 3 minutes at room temperature with power consumption of 0.3 watt per square centimeter, and it will be seen that any substantial variation in short circuit current does not occur as time elapses. At an ambient temperature of 100° C. a substantially similar effect can be observed with an aging treatment for 1 minute with power consumption of 0.1 watt per square centimeter.

It will be appreciated from the foregoing description that photovoltaic cells showing stable performance can be easily made by use of cadmium sulfide at low cost and in any desired shape. It will further be appreciated that the present invention is not limited to the method employing powdered cadmium sulfide, but is also applicable to those cases which employ powdered cadmium selenide or powdered solid solution of cadmium sulfide and cadmium selenide.

What is claimed is:

1 A method of making a photovoltaic cell employing powdered polycrystalline photoelectric material and comprising the steps of molding said powdery material under pressure and heat to obtain a compression molded block; forming a sintered film of said powdery material on said compression molded block and depositing a metal on said sintered film to diffuse thereinto for converting said sintered film into an opposite conductivity type to that of the film to form a PN junction between said block and said sintered film.

2. A method of making a photovoltaic cell according to claim 1, wherein said photoelectric material is selected from the group consisting of cadmium sulfide, cadmium selenide and their solid solution.

3. A method of making a photovoltaic cell according to claim 1, wherein said metal is copper and the cell assembly is heated in an atmosphere containing 1.5 to 20 percent oxygen or sulfur so that copper diffuses into said sintered film to convert the same into a P-type layer.

4. A method of making a photovoltaic cell according to claim 1, wherein the cell assembly is further subjected to an aging treatment by applying electric power and heat thereto.

* * * * *

UNITED STATES PATENT OFFICE
CERTIFICATE OF CORRECTION

Patent No. 3,615,877 Dated October 26, 1971

Inventor(s) Kazuo YAMASHITA

It is certified that error appears in the above-identified patent and that said Letters Patent are hereby corrected as shown below:

1. The Assignee should be listed as follows:

--MATSUSHITA ELECTRIC INDUSTRIAL CO., LTD. --.

2. Reference should be made to the parent application as follows:

--This is a divisional application of Serial N° 580,663 filed September 20, 1966. --.

3. Correct the Claim for Convention Priority to read as follows:

--Japan, 59271 filed September 25, 1965;
Japan, 75452 filed December 2, 1965; and
Japan, 41147 filed June 22, 1966. --.

Signed and sealed this 11th day of July 1972.

(SEAL)
Attest:

EDWARD M.FLETCHER,JR.
Attesting Officer

ROBERT GOTTSCHALK
Commissioner of Patents